(12) United States Patent
Jin et al.

(10) Patent No.: US 9,373,652 B2
(45) Date of Patent: Jun. 21, 2016

(54) DISPLAY APPARATUS AND METHOD OF MANUFACTURING THE SAME

(71) Applicant: Samsung Display Co., Ltd., Yongin, Gyeonggi-Do (KR)

(72) Inventors: Guanghai Jin, Yongin (KR); Nayoung Kim, Yongin (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 14/806,221

(22) Filed: Jul. 22, 2015

(65) Prior Publication Data

US 2016/0027857 A1    Jan. 28, 2016

(30) Foreign Application Priority Data

Jul. 24, 2014    (KR) .................. 10-2014-0094152

(51) Int. Cl.
| | |
|---|---|
| *H01L 29/12* | (2006.01) |
| *H01L 27/12* | (2006.01) |
| *H01L 21/3213* | (2006.01) |
| *H01L 29/66* | (2006.01) |
| *H01L 29/786* | (2006.01) |

(52) U.S. Cl.
CPC ........ *H01L 27/1259* (2013.01); *H01L 21/3213* (2013.01); *H01L 27/1255* (2013.01); *H01L 29/66757* (2013.01); *H01L 29/78666* (2013.01); *H01L 29/78675* (2013.01)

(58) Field of Classification Search
CPC ............ H01L 27/3265; H01L 27/1259; H01L 27/1255
USPC .......................................................... 257/71
See application file for complete search history.

(56) References Cited

U.S. PATENT DOCUMENTS

| | | |
|---|---|---|
| 2011/0079786 A1 | 4/2011 | Kwon et al. |
| 2011/0215335 A1 | 9/2011 | Kwon et al. |
| 2012/0146031 A1 | 6/2012 | Lee |
| 2013/0032805 A1 | 2/2013 | Kim et al. |
| 2013/0134424 A1 | 5/2013 | Kim et al. |

FOREIGN PATENT DOCUMENTS

| | | |
|---|---|---|
| KR | 10-2011-0037408 A | 4/2011 |
| KR | 10-2011-0099996 A | 9/2011 |
| KR | 10-2012-0063745 A | 6/2012 |
| KR | 10-2013-0014859 A | 2/2013 |
| KR | 10-2013-0060915 A | 6/2013 |

*Primary Examiner* — Douglas Menz
(74) *Attorney, Agent, or Firm* — Knobbe Martens Olson & Bear LLP (57) ABSTRACT

Provided are a display apparatus and a method of manufacturing the display apparatus. The display apparatus includes: a substrate having a major surface; and a capacitor disposed over the substrate. The capacitor includes a first electrode, and a second electrode disposed over the first electrode. The second electrode includes a first region, a second region and an opening when viewed in a direction perpendicular to the major surface. The first region has a first thickness, and a second region has a second thickness that is greater than the first thickness.

20 Claims, 7 Drawing Sheets

DISPLAY APPARATUS AND METHOD OF MANUFACTURING THE SAME

RELATED APPLICATION

This application claims the benefit of Korean Patent Application No. 10-2014-0094152, filed on Jul. 24, 2014, in the Korean Intellectual Property Office, the disclosure of which is incorporated herein in its entirety by reference.

BACKGROUND

1. Field

One or more embodiments of the present invention relate to a display apparatus and a method of manufacturing the display apparatus.

2. Description of the Related Art

An organic light emitting display apparatus is a self-emissive display apparatus that includes a hole injection electrode, an electron injection electrode, and an organic emission layer formed between the hole injection electrode and the electron injection electrode, wherein holes injected through the hole injection electrode and electrons injected through the electron injection electrode are recombined and extinguished to emit light. The organic light emitting display apparatus is considered as a next generation display apparatus owing to its excellent characteristics such as low power consumption, high brightness, and fast response speed.

SUMMARY

One or more embodiments of the present invention include a display apparatus capable of reducing manufacturing costs and providing high resolution images.

Additional aspects will be set forth in part in the description which follows and, in part, will be apparent from the description, or may be learned by practice of the presented embodiments.

According to one or more embodiments of the present invention, a display apparatus includes: a substrate comprising a major surface; and a capacitor disposed over the substrate, the capacitor including a first electrode, a second electrode disposed over the first electrode, the second electrode comprising a first region, a second region and an opening when viewed in a direction perpendicular to the major surface, the first region having a first thickness, a second region having a second thickness that is greater than the first thickness, and a first insulating layer disposed between the first electrode and the second electrode.

The first electrode may include a semiconductor layer, and substantially the entire portion of the first electrode is doped with impurities.

The first electrode may include: a concave portion recessed from a side when viewed in the direction.

The opening of the second electrode may overlap at least partially with the concave portion when viewed in the direction.

The first region of the second electrode may overlap with the first electrode, and the second region of the second electrode may not overlap with the first electrode when viewed in the direction.

The first electrode may be electrically connected to an external line through a contact hole exposing the first electrode in a region overlapping with the opening when viewed in the direction.

The display apparatus may further include: a second insulating layer contacting an upper surface of the second region of the second electrode; and a third insulating layer contacting an upper surface of the first region of the second electrode.

The display apparatus may further include a thin film transistor including: an active layer formed at a level substantially the same as that of the first electrode, and a gate electrode formed at another level substantially the same as that of the second electrode, wherein the first insulating layer is disposed between the active layer and the gate electrode.

The gate electrode may have the second thickness.

According to one or more embodiments of the present invention, a method of manufacturing a display apparatus, the method comprising: providing a substrate; and forming a capacitor over the substrate, wherein the capacitor comprises a first electrode of a capacitor, a second electrode and a first insulating layer disposed between the first electrode and the second electrode, wherein the second electrode comprises a first region, a second region and an opening when viewed in a direction perpendicular to a major surface of the substrate, the first region having a first thickness, a second region having a second thickness that is greater than the first thickness.

The first electrode of the capacitor may comprise a concave portion recessed from a side of the first electrode when viewed in the direction, wherein the concave portion partially overlaps with the opening when viewed in the direction.

The forming of the capacitor may comprise forming the second electrode, which comprises: forming a metallic layer portion having the second thickness and including the opening over the first insulating layer; forming a second insulating layer on the metallic layer portion; and etching the second insulating layer and the metallic layer portion such that a portion of the metallic layer portion has the first thickness, thereby forming the second electrode comprising the first region with the first thickness and the second region with the second thickness.

The forming of the capacitor may comprise forming the first electrode, which comprises: forming a semiconductor layer portion over the substrate; prior to the forming of the second insulating layer, primarily doping the semiconductor layer portion with impurities through the opening of the metallic layer portion; and subsequently to the etching, secondarily doping the semiconductor layer portion with impurities through the first region of the second electrode.

The method may further comprise forming a contact hole through the second insulating layer such that the contact hole exposes a portion of the first electrode which overlaps with the opening when viewed in the direction.

The method may further comprise forming a conductive connector connecting the first electrode to an external line via the contact hole.

The method may further comprise forming, on the second electrode, a third insulating layer covering and contacting the first region of the second electrode.

The method may further comprise forming a thin film transistor, which comprises: forming another semiconductor layer portion simultaneously with the forming of the semiconductor layer portion; forming a gate electrode simultaneously with the forming of the metallic layer portion; and doping the other semiconductor layer portion with impurities thereby forming an active layer comprising a source and a drain, wherein the doping of the other semiconductor layer portion is simultaneous with the doping of the semiconductor layer portion.

The gate electrode may have the second thickness.

In the foregoing method, the forming of the capacitor may comprise: forming a semiconductor layer portion over the substrate; forming the first insulating layer; forming a metallic layer portion having the second thickness and including the opening over the first insulating layer; forming a second insulating layer on the metallic layer portion; etching the second insulating layer and the metallic layer portion such that a portion of the metallic layer portion has the first thickness, thereby forming the second electrode; prior to the forming of the second insulating layer, primarily doping the semiconductor layer portion with impurities through the opening of the metallic layer portion; and subsequently to the etching, secondarily doping the semiconductor layer portion with impurities through the first region of the second electrode, thereby forming the first electrode.

BRIEF DESCRIPTION OF THE DRAWINGS

These and/or other aspects will become apparent and more readily appreciated from the following description of the embodiments, taken in conjunction with the accompanying drawings in which.

DETAILED DESCRIPTION

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description.

Hereinafter, the present invention will be described in detail by explaining preferred embodiments of the invention with reference to the attached drawings. Like reference numerals in the drawings denote like elements.

It will be understood that although the terms "first", "second", etc. may be used herein to describe various components, these components should not be limited by these terms. These components are only used to distinguish one component from another.

As used herein, the singular forms "a," "an" and "the" are intended to include the plural forms as well, unless the context clearly indicates otherwise.

It will be further understood that the terms "comprises" and/or "comprising" used herein specify the presence of stated features or components, but do not preclude the presence or addition of one or more other features or components.

It will be understood that when a layer, region, or component is referred to as being "formed on," another layer, region, or component, it can be directly or indirectly formed on the other layer, region, or component. That is, for example, intervening layers, regions, or components may be present.

Sizes of elements in the drawings may be exaggerated for convenience of explanation. In other words, since sizes and thicknesses of components in the drawings are arbitrarily illustrated for convenience of explanation, the following embodiments are not limited thereto. As used herein, the term "and/or" includes any and all combinations of one or more of the associated listed items. Expressions such as "at least one of," when preceding a list of elements, modify the entire list of elements and do not modify the individual elements of the list.

Figure 1:
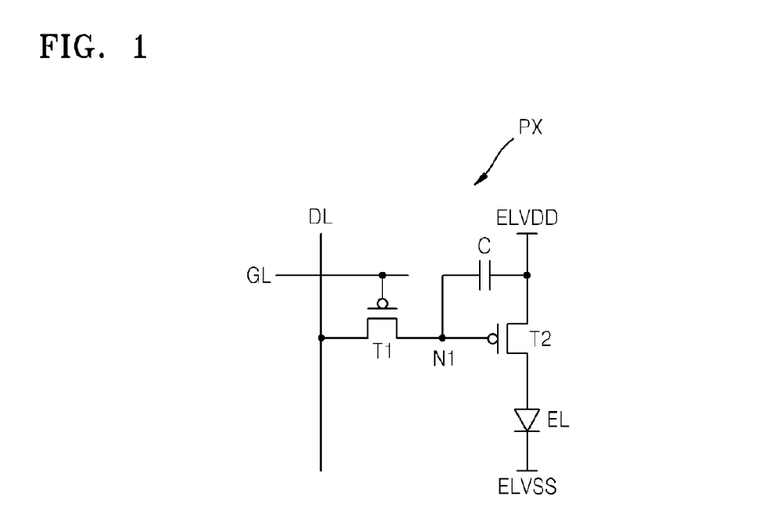
FIG. 1 is an equivalent circuit diagram of a pixel in a display apparatus according to an embodiment of the present invention.

FIG. 1 is an equivalent circuit diagram of a pixel of a display apparatus according to an embodiment of the present invention.

A display apparatus includes a pixel array including a plurality of pixels, and a plurality of data lines and a plurality of gate lines connected to the plurality of pixels. The plurality of pixels are respectively located at regions where the data lines and the gate lines cross each other to be arranged as a matrix.

Referring to FIG. 1, a pixel PX includes a first switching device T1, a second switching device T2, a capacitor C, and a light emitting element EL. In FIG. 1, the pixel PX is not limited to a pixel circuit shown in FIG. 1. The pixel PX of FIG. 1 may further include a compensation circuit compensating for characteristics (for example, a threshold voltage) of the switching devices T1 and T2. The pixel PX of FIG. 1 may include three or more switching devices, or two or more capacitors. As shown in FIG. 1, the first switching device T1 and the second switching device T2 may be P-type transistors, respectively. However, the present invention is not limited thereto. In alternative embodiments, at least some of the switching devices T1 and T2 may be formed as N-type transistors. Hereinafter, it is assumed that the switching devices T1 and T2 are P-type transistors.

The pixel PX is connected to a data line DL and a gate line GL. The pixel PX receives a first power voltage ELVDD and a cathode electrode of the light emitting element EL may be connected to a second power voltage EVLSS. According to another embodiment, the cathode electrode of the light emitting element EL may be connected to the first power voltage ELVDD.

The first switching device T1 includes a gate connected to the gate line GL, a first connection terminal (for example, a source) connected to the data line DL, and a second connection terminal (for example, a drain) connected to a first node N1. The second switching device T2 includes a gate connected to the first node N1, a first connection terminal (for example, a source) to which the first power voltage ELVDD is applied, and a second connection terminal (for example, a drain) connected to an anode electrode of the light emitting element EL. The capacitor C is connected between the first node N1 and a line supplying the first power voltage ELVDD. The light emitting element EL may be an organic light emitting device (OLED) including an anode electrode, a cathode electrode, and a light emission layer disposed between the anode electrode and the cathode electrode.

The first switching device T1 transmits an image signal transmitted through the data line DL to the first node N1, in response to a scan signal transmitted through the gate line GL. The capacitor C stores a voltage of the image signal applied to the first node N1. The second switching device T2 generates a driving current (for example, a drain current) in correspondence with the voltage of the image signal stored in the capacitor C, and provides the light emitting element EL with the driving current. The light emitting element EL emits light in response to the driving current, having brightness corresponding to the image signal.

As shown in FIG. 1, if the second switching device T2 is formed as the P-type transistor, the second switching device T2 generates a driving current having a magnitude that is proportional to a difference between the first power voltage ELVDD level and a voltage level of the image signal. That is, when the voltage level of the image signal is increased, the magnitude of the driving current is reduced and the brightness of the light emitted from the light emitting element EL is reduced. In addition, when the voltage level of the image signal is reduced, the magnitude of the driving current increases and the brightness of light emitted from the light emitting element EL is increased.

Figure 2:
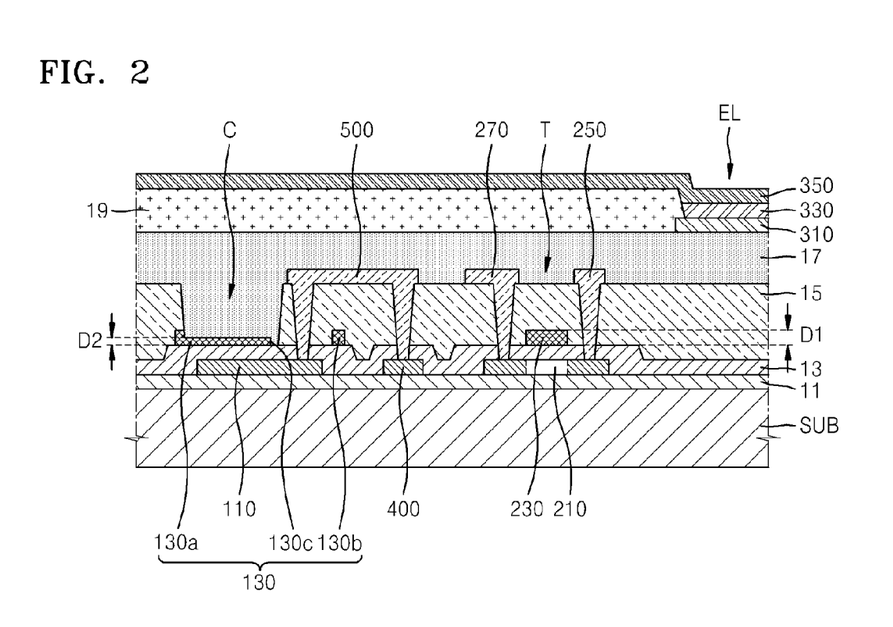
FIG. 2 is a cross-sectional view of the pixel shown in FIG. 1.

FIG. 2 is a cross-sectional view of the pixel PX of FIG. 1.

Referring to FIG. 2, the display apparatus according to an embodiment of the present invention includes the light emitting element EL, a thin film transistor T, and a capacitor C disposed on a substrate SUB, on which a buffer layer 11 is formed. The thin film transistor T may be one of the first and second switching devices T1 and T2 shown in FIG. 1.

The capacitor C includes a first electrode 110 and a second electrode 130.

The first electrode 110 of the capacitor C is located at the same layer level as that of an active layer 210 of the thin film transistor T. The first electrode 110 of the capacitor C may be formed of semiconductor doped with ion impurities, like a source region and a drain region in the active layer 210.

The first electrode 110 of the capacitor C may be electrically connected to an external line 400 via a connection wire 500 through a contact hole exposing a part of the first electrode 110. The external line 400 may be a part of the active layer 210 of the thin film transistor T. The connection wire 500 may be formed at the same layer level as those of a source electrode 250 and a drain electrode 270 of the thin film transistor T by using the same material as those of the source electrode 250 and the drain electrode 270, on a second insulating layer 15.

The second electrode 130 of the capacitor C includes an opening 130c, and includes a first region 130a having a second thickness D2 and a second region 130b having a first thickness D1. The contact hole exposing a part of the first electrode 110 of the capacitor C is formed on a part of a region in the first electrode 110, which corresponds to the opening 130c of the second electrode 130.

The second electrode 130 of the capacitor C is located at the same layer level as that of a gate electrode 230 of the thin film transistor T. The second electrode 130 of the capacitor C may be formed of the same material as that of the gate electrode 230. The first thickness D1 of the second region 130b of the second electrode 130 is the same as a thickness D1 of the gate electrode 230. The second thickness D2 of the first region 130a of the second electrode 130 is less than the first thickness D1. As will be described later, the semiconductor doped with ion impurities is formed as the first electrode 110 through the opening 130c and the first region 130a of the capacitor C, and thus, the capacitor C may be formed to have a metal-insulator-metal (MIM) structure.

The first region 130a in the second electrode 130 of the capacitor C overlaps with the first electrode 110 and the second region 130b does not overlap with the first electrode 110. In addition, in the second electrode 130 of the capacitor C, the first region 130a contacts a third insulating layer 17 and the second region 130b contacts the second insulating layer 15.

A first insulating layer 13 is located between the first electrode 110 and the second electrode 130 of the capacitor C, and the first insulating layer 13 may function as a dielectric layer of the capacitor C.

The thin film transistor T includes the active layer 210, the gate electrode 230, the source electrode 250, and the drain electrode 270.

The active layer 210 may include a channel region, and source and drain regions formed at opposite ends of the channel region and doped with the ion impurities. The active layer 210 may be formed to include various materials. For example, the active layer 210 may include an inorganic semiconductor material such as amorphous silicon or crystalline silicon. As another example, the active layer 210 may include oxide semiconductor. Otherwise, the active layer 210 may include an organic semiconductor material.

The first insulating layer 13 is formed on the active layer 210 as a gate insulating layer, and the gate electrode 230 is formed on the first insulating layer 13 at a location corresponding to the channel region.

The gate electrode 230 may be formed to have a single-layered structure or a multi-layered structure by using one or more metal materials selected from aluminum (Al), platinum (Pt), palladium (Pd), silver (Ag), magnesium (Mg), gold (Au), nickel (Ni), neodymium (Nd), iridium (Ir), chrome (Cr), lithium (Li), calcium (Ca), molybdenum (Mo), titanium (Ti), tungsten (W), and copper (Cu).

The second insulating layer 15 that is an interlayer dielectric layer is formed on the gate electrode 230, and the source electrode 250 and the gate electrode 270 are disposed on the second insulating layer 15.

The source electrode 250 and the drain electrode 270 may respectively contact the source region and the drain region of the active layer 210 via contact holes formed in the second insulating layer 15 and the first insulating layer 13. The source electrode 250 and the drain electrode 270 may be formed by stacking two or more layers of different metal materials having different electron mobilities. For example, the source electrode 250 and the drain electrode 270 may be formed by stacking two or more layers of one or more metal selected from Al, Pt, Pd, Ag, Mg, Au, Ni, Nd, Ir, Cr, Li, Ca, Mo, Ti, W, and Cu.

Data lines and/or power supply lines formed of the same material as those of the source and drain electrodes 250 and 270 may be formed at the same layer level as those of the source and drain electrodes 250 and 270.

The structure of the thin film transistor shown in FIG. 2 is an example in which the display apparatus according to the embodiment of the present invention, and one or more embodiments of the present invention are not limited to the structure of the thin film transistor of FIG. 2.

The third insulating layer 17 is disposed on the capacitor C and the thin film transistor T.

The light emitting element EL may be an OLED that includes a pixel electrode (anode electrode) 310, an opposite electrode (cathode electrode) 350 facing the pixel electrode 310, and an organic emission layer 330 located between the pixel electrode 310 and the opposite electrode 350.

At least one selected from a hole injection layer (HIL), a hole transport layer (HTL), an electron transport layer (ETL), and an electron injection layer (EIL) may be further disposed between the pixel electrode 310 and the opposite electrode 350, in addition to the organic emission layer 330. However, the present embodiment is not limited thereto, but other various functional layers may be further formed.

The OLED of FIG. 2 shows an example of a sub-pixel configuring a unit pixel, and the sub-pixel may emit light of various colors. For example, the sub-pixel may emit red, green, or blue light.

As another example, the sub-pixel may emit white light. If the sub-pixel emits the white light, the display apparatus may further include a color converting layer or a color filter for changing the white light into another color. The sub-pixel emitting the white light may have various structures, for example, a stacked structure of a light emitting material emitting red light, a light emitting material emitting green light, and a light emitting material emitting blue light.

As another example of the sub-pixel emitting the white light, the sub-pixel may have a structure, in which at least a light emitting material emitting red light, a light emitting material emitting green light, and a light emitting material emitting blue light are mixed.

The red, green, and blue light are examples, and the embodiment of the present invention is not limited thereto. That is, other various colors may be combined in addition to the combination of the red, green, and blue light, provided that the white light may be emitted.

FIGS. 3 through 13 are plan views and cross-sectional views illustrating a method of manufacturing a display apparatus according to an embodiment of the present invention. Hereinafter, descriptions may be provided with reference to a cross-sectional view and a plan view corresponding to each other.

Figure 3:
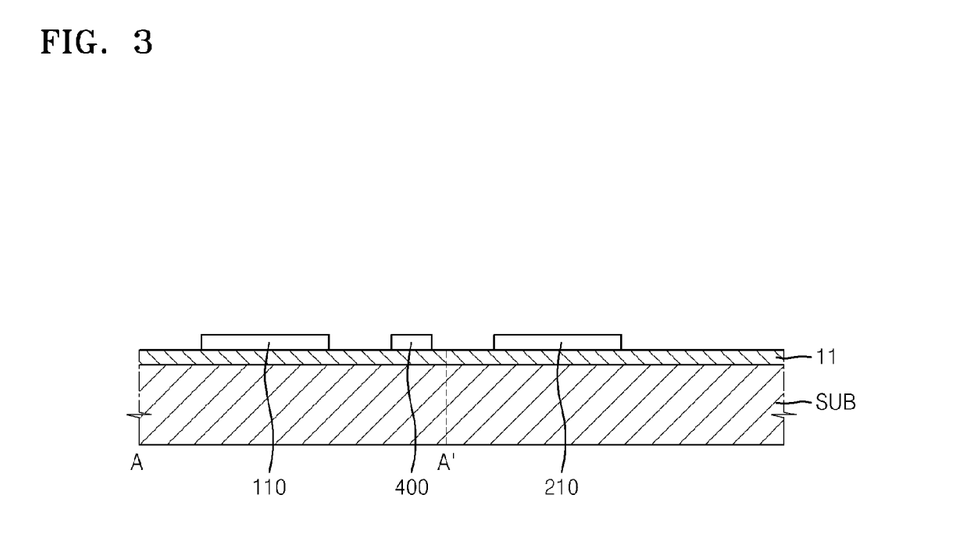
FIGS. 3 through 13 are views illustrating a method of manufacturing a display apparatus according to an embodiment of the present invention.
Figure 4:
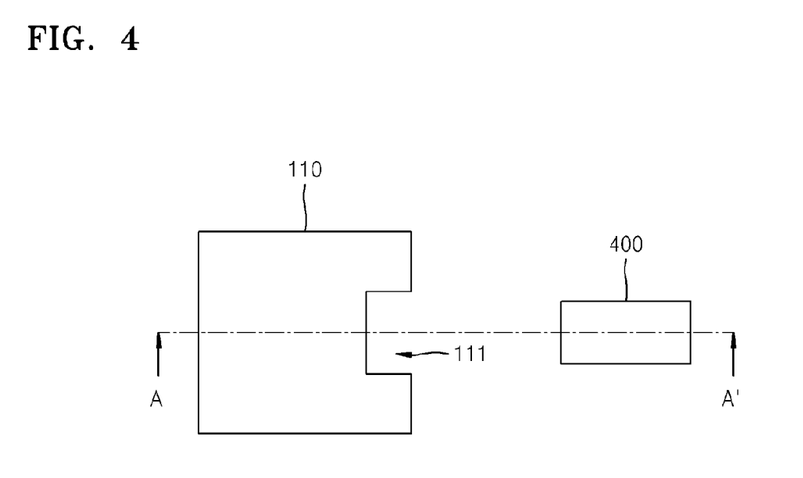

Referring to FIGS. 3 and 4, the buffer layer 11 is formed on the substrate SUB, a semiconductor layer is formed on the buffer layer 11, and then, the semiconductor layer is patterned (etched) in order to form a first semiconductor layer portion for forming the active layer 210 of the thin film transistor T and a second semiconductor layer portion form forming the first electrode 110 of the capacitor C. In embodiments, the first and second semiconductor layer portions may be formed at the substantially same level or elevation which is a distance from the substrate in a thickness direction of the substrate. The first and second semiconductor layer portions are later doped with impurities and become the active layer 210 and the first electrode 110. In an embodiment, at least one external line 400 may be formed by patterning the semiconductor layer.

The substrate SUB may be a plastic substrate including polyethylene terephthalate (PET), polyethylene naphthalate (PEN), or polyimide, as well as a glass substrate.

The buffer layer 11 for forming a planarization surface on the substrate SUB and preventing impurities from infiltrating into the substrate SUB may be further disposed on the substrate SUB. The buffer layer 11 may be formed to have a single-layered or a multi-layered structure including silicon nitride and/or silicon oxide.

The semiconductor layer may be formed of amorphous silicon or polysilicon. Here, the polysilicon may be formed by crystallizing the amorphous silicon. The amorphous silicon may be crystallized by a rapid thermal annealing (RTA) method, a solid phase crystallization (SPC) method, an excimer laser annealing (ELA) method, a metal induced crystallization (MIC) method, a metal induced lateral crystallization (MULC) method, or a sequential lateral solidification (SLS) method. However, the embodiments of the present invention are not limited to the amorphous silicon or the polysilicon, that is, the semiconductor layer may include oxide semiconductor or organic semiconductor.

The first electrode 110 of the capacitor C may include a concave portion 111 in at least a side surface thereof. The concave portion 111 is formed on a region corresponding to a wire that connects the first electrode 110 to the external line 400, and thus, a location of the concave portion 111 may vary depending on a location of the wire that will be formed later.

Figure 5:
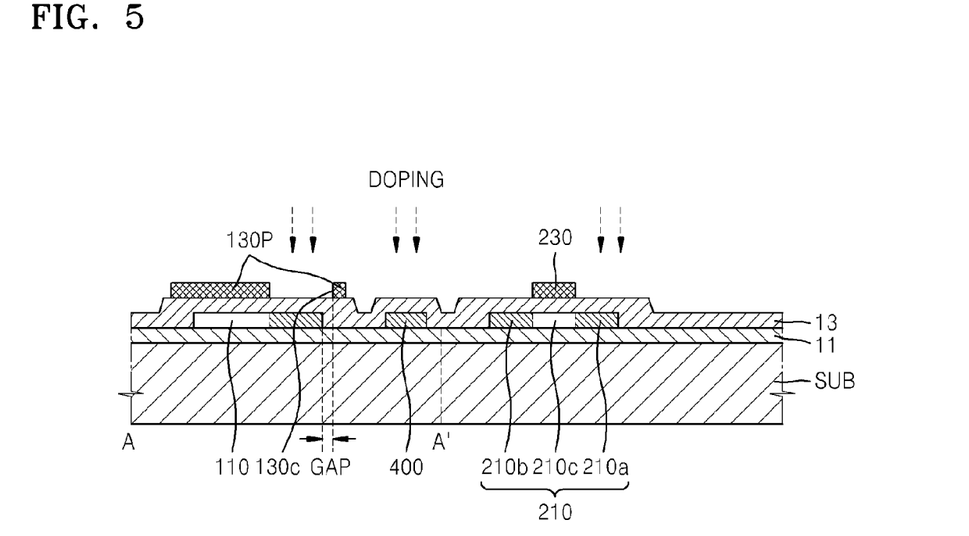
Figure 6:
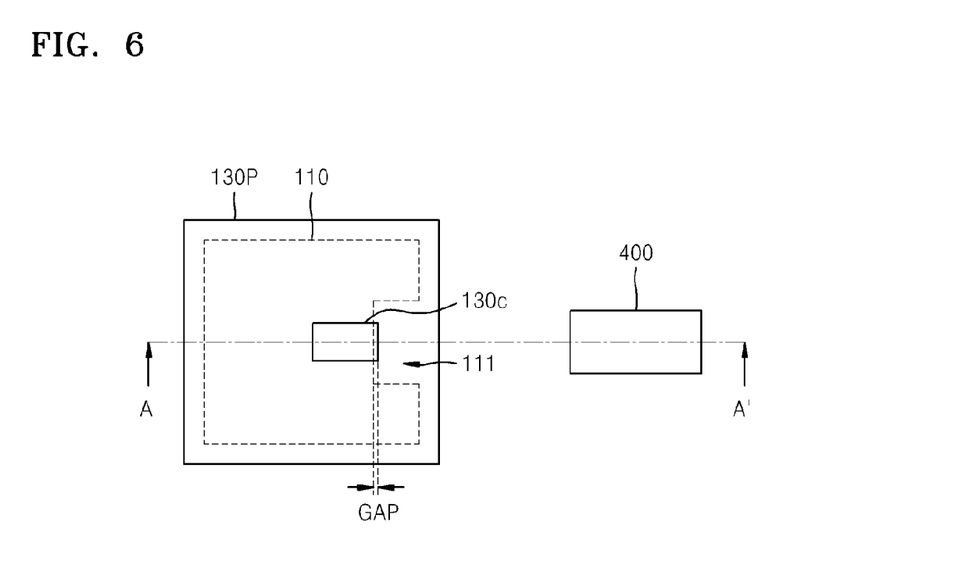

Referring to FIGS. 5 and 6, the gate electrode 230 of the thin film transistor T and a metallic layer portion 130P for forming the second electrode 130 of the capacitor C are formed on the substrate SUB.

The first insulating layer 13 is formed on the substrate SUB, on which the active layer 210 of the thin film transistor T, the first electrode 110 of the capacitor C, and the external line 400 are formed. In addition, a first metal layer is stacked on the first insulating layer 13, and then, is patterned.

The first insulating layer 13 may be formed as an inorganic insulating layer. The first insulating layer 13 may have a single-layered structure or a multi-layered structure including one or more insulating materials selected from $SiO_2$, SiNx, SiON, $Al_2O_3$, $TiO_2$, $Ta_2O_5$, $HfO_2$, $ZrO_2$, BST, and PZT.

The first metal layer may be formed as a single-layer or a multi-layer including one or more selected from Al, Pt, Pd, Ag, Mg, Au, Ni, Nd, Ir, Cr, Li, Ca, Mo, Ti, W, and Cu.

As a result of the patterning, the gate electrode 230 of the thin film transistor T and the metallic layer portion 130P of the capacitor C are formed on the first insulating layer 13. The gate electrode 230 of the thin film transistor T and the metallic layer portion 130P of the capacitor C have a first thickness D1. The first thickness D1 may be about 2000 to about 2500 Å. In embodiments, the gate electrode 230 and the metallic layer portion 130P may be formed at the substantially same level or elevation.

The metallic layer portion 130P of the capacitor C has an opening 130c, and the metallic layer portion 130P has a size and shape that covers the entire first electrode 110 of the capacitor C. A side of the opening 130c is located at an outer portion of the concave portion 111 so as to have a gap GAP between the opening 130c and a lowermost end of the concave portion 111 of the first electrode 110. Thus, the first electrode 110 of the capacitor C may be easily connected to the external line 400, e.g., the peripheral active layer 210, via the gap GAP.

Next, the substrate SUB is primarily doped with ion impurities. The ion impurities may be P-type or N-type impurities. A target of the primary doping is the active layer 210 of the thin film transistor T and the first electrode 110 of the capacitor C with a predetermined concentration and acceleration voltage.

The active layer 210 is doped with the ion impurities by using the gate electrode 230 as a self-align mask. Then, the active layer 210 includes the source region 210a and the drain region 210b doped with the ion impurities, and the channel region 210c located between the source region 210a and the drain region 210b.

Figure 7:
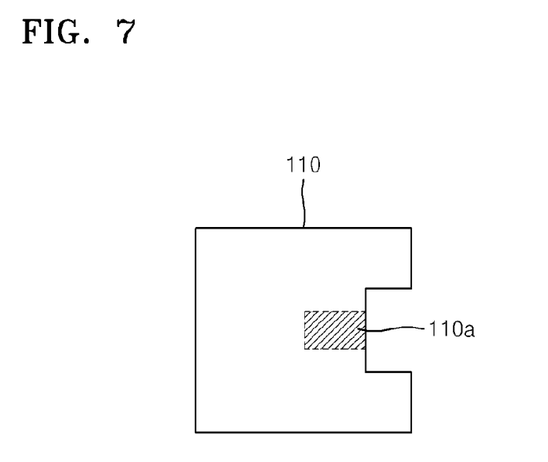

The first electrode 110 is doped with the ion impurities via the opening 130c by using the metallic layer portion 130P located on the first electrode 110 as a self-align mask. Through the primary doping, the first region 110a of the first electrode 110, which corresponds to (overlaps with) the opening 130c of the metallic layer portion 130P, is doped with the ion impurities as shown in FIG. 7.

The external line 400 is also doped with the ion impurities.

Figure 8:
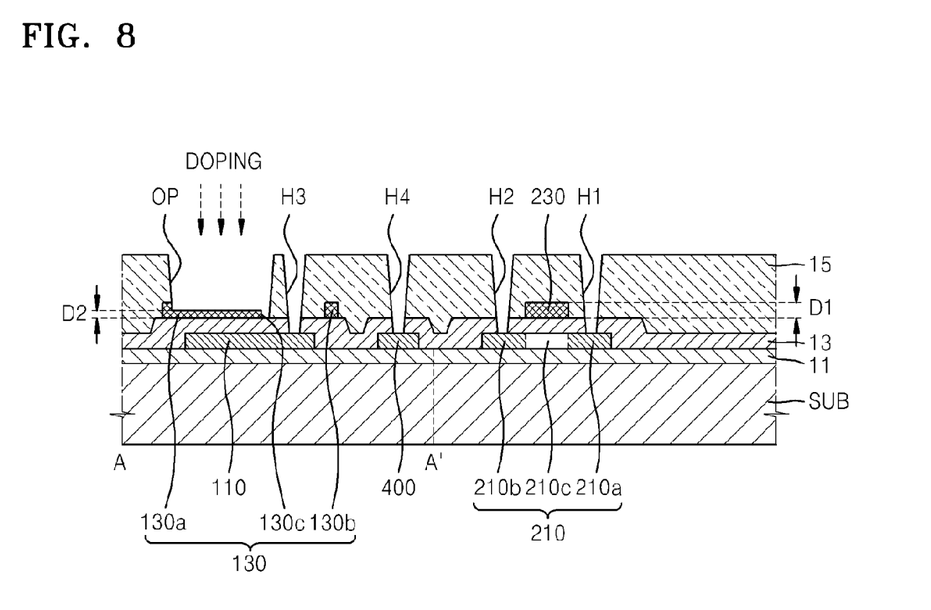
Figure 9:
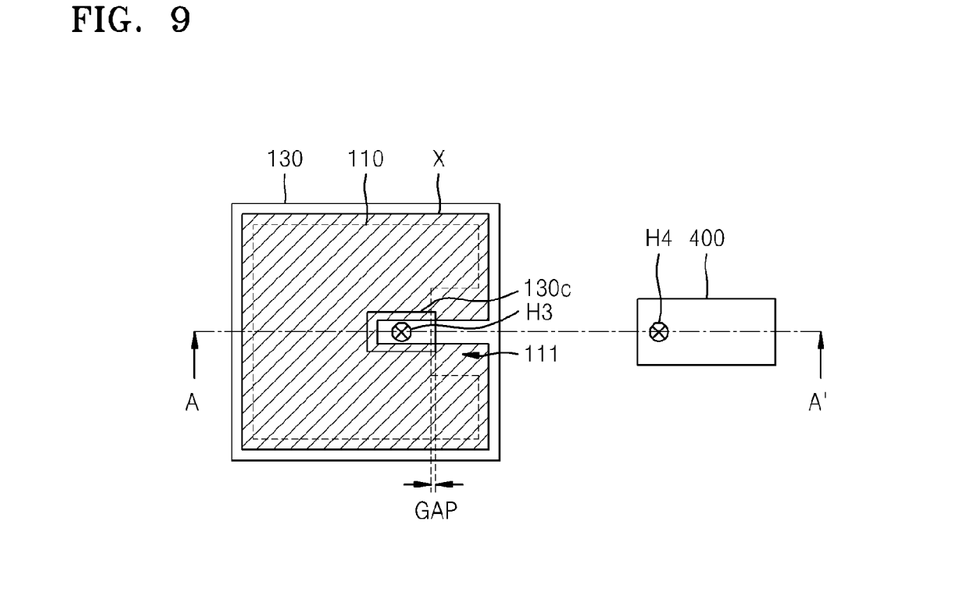

Referring to FIGS. 8 and 9, the second insulating layer 15 is formed on a resultant of the doping process shown in FIGS. 5 and 6, and contact holes H1 and H2 exposing the source region 210a and the drain region 210b of the active layer 210, a contact hole H3 exposing a part of the first electrode 110, and a contact hole H4 exposing a part of the external line 400 are formed in the second insulating layer 15.

The second insulating layer 15 may be formed as an inorganic insulating layer. The second insulating layer 15 may be formed to have a single-layered structure or a multi-layered structure including one or more insulating materials selected from $SiO_2$, SiNx, SiON, $Al_2O_3$, $TiO_2$, $Ta_2O_5$, $HfO_2$, $ZrO_2$, BST, and PZT. Otherwise, the second insulating layer 15 may be formed with an organic insulating material.

The contact hole H3 exposes a part of the region in the first electrode 110, wherein the region overlaps with the opening 130c of the metallic layer portion 130P.

When forming the contact holes H1, H2, H3, and H4 in the second insulating layer 15, an etching region X on the metallic layer portion 130P shown in FIG. 9 is etched. The second insulating layer 15 and the metallic layer portion 130P corresponding to (overlapping with) the etching region X are etched.

Figure 10:
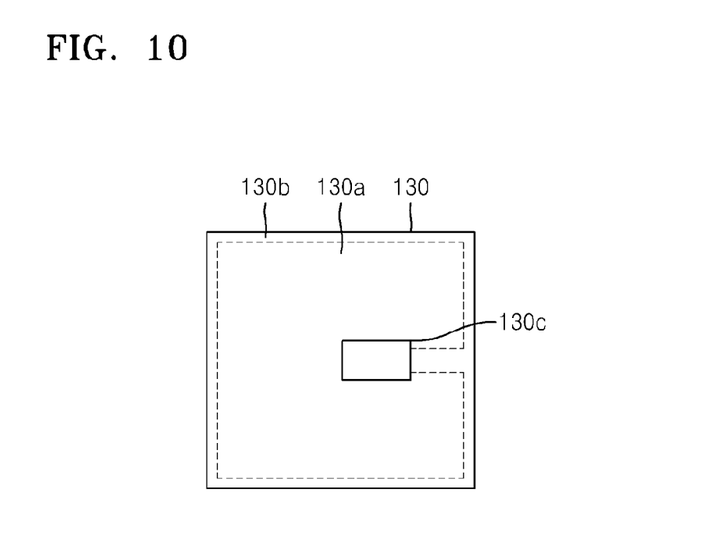

As shown in FIG. 10, the second electrode 130 including the second region 130b having the first thickness D1 and the first region 130a having the second thickness D2 is formed by etching the metallic layer portion 130P. During this process, an opening OP that exposes the first region 130a of the second electrode 130 is formed in the second insulating layer 15. The first region 130a of the second electrode 130 overlaps with the first electrode 110, except for the first region 110a doped by the primary doping.

The second thickness D2 is a thickness through which the ion impurities may pass, and may be determined by an environment in which the ion impurities are doped, for example, an acceleration voltage. The second thickness D2 may be about 1000 Å or less. If a high acceleration voltage is used so that the ion impurities may sufficiently pass through the first thickness D1 of the metallic layer portion 130P, the second electrode 130P may be formed as the second electrode 130 without being etched. In this case, the second thickness D2 may be equal to the first thickness D1.

Next, the substrate SUB is secondarily doped with ion impurities. In the secondary doping, the ion impurities may be the same as those of the primary doping, and the first electrode 110 of the capacitor C is the target of the secondary doping.

Since the first region 130a of the second electrode 130 in the capacitor C is formed to have a thickness through which the ion impurities may pass by the etching operation, the first electrode 110 is doped with the ion impurities.

As results of the primary and secondary doping operations, the first electrode 110 entirely doped with the ion impurities forms the MIM capacitor structure with the second electrode 130, and thus, a margin in voltage may be increased when designing the circuit.

Also, the second electrode 130 of the capacitor C is used as the mask in the two doping operations, and thus, there is no need to use an additional mask for doping the capacitor C. In addition, the second electrode 130 of the capacitor C is formed of the same material at the same layer as those of the gate electrode and is etched, and then, the MIM capacitor may be formed without using a half-tone mask. In addition, since the capacitor C uses the gate insulating layer that has a thickness less than that of the interlayer dielectric layer as a dielectric layer, a capacity may be increased without increasing an area of the capacitor C.

Figure 11:
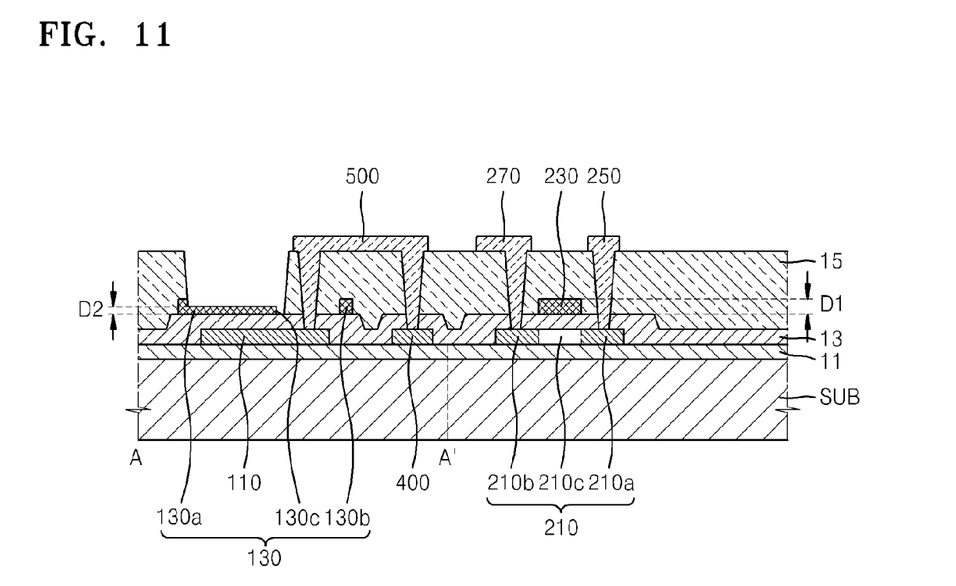
Figure 12:
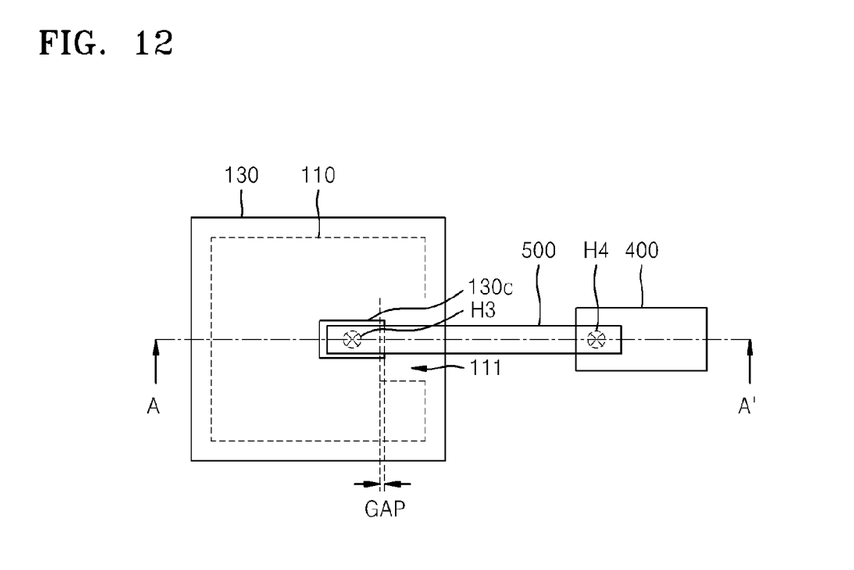

Referring to FIGS. 11 and 12, a second metal layer is formed on a resultant of the processes shown in FIGS. 8 and 9, and the second metal layer is patterned to form the source electrode 250 and the drain electrode 270. In addition, a connection wire 500 connecting the first electrode 110 of the capacitor C to the external line 400 is formed.

The second metal layer may include two or more metal layers formed of different kinds of metal having different electron mobilities. For example, the second metal layer may include two or more layers formed of the metal selected from Al, Pt, Pd, Ag, Mg, Au, Ni, Nd, Ir, Cr, Li, Ca, Mo, Ti, W, Cu, and alloys thereof.

A data line and a power supply line may be further formed by patterning the second metal layer.

Figure 13:
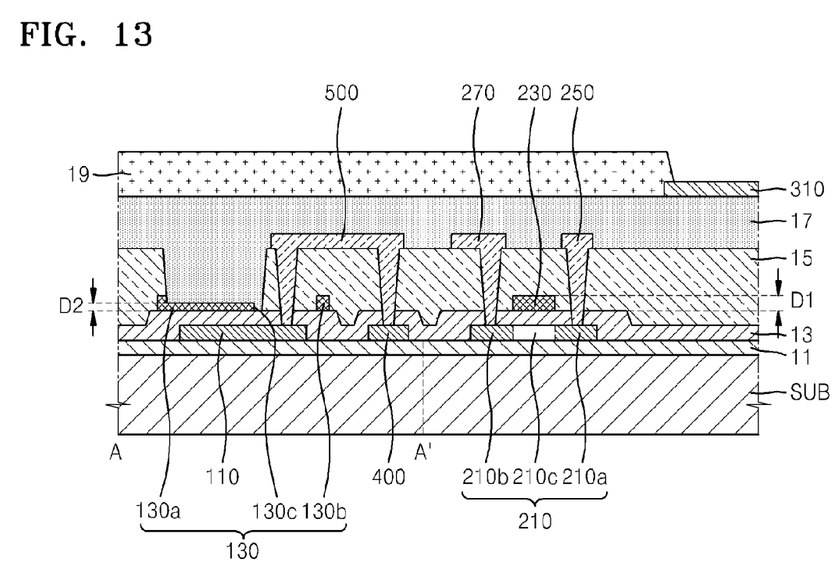

Referring to FIG. 13, the third insulating layer 17 is formed on the resultant of the processes shown in FIGS. 11 and 12, and the pixel electrode 310 is formed on the third insulating layer 17.

The third insulating layer 17 may be formed to have a single-layered or a multi-layered structure including an inorganic insulating layer and/or an organic insulating layer. The inorganic insulating layer may be formed of $SiO_2$, SiNx, SiON, $Al_2O_3$, $TiO_2$, $Ta_2O_5$, $HfO_2$, $ZrO_2$, BST, or PZT. The organic insulating layer may include a general universal polymer (PMMA or PS), polymer derivatives having phenol groups, acryl-based polymer, imide-based polymer, aryl ether-based polymer, amide-based polymer, fluoride-based polymer, p-xylene-based polymer, vinyl alcohol-based polymer, and blends thereof. For example, the third insulating layer 17 may be formed of polyimide having less out-gassing.

The third insulating layer 17 may include a via hole for electrically connecting the pixel electrode 310 and the thin film transistor T to each other. The pixel electrode 310 is formed on the third insulating layer 17 in which the via hole is formed. The pixel electrode 310 may be electrically connected to one of the source electrode 250 and the drain electrode 270 of the thin film transistor T via the via hole.

A fourth insulating layer 19 is formed on the substrate SUB on which the pixel electrode 310 is formed, and the fourth insulating layer 19 is patterned to form an opening exposing an upper portion of the pixel electrode 310. The fourth insulating layer 19 is patterned to cover end portions of the pixel electrode 310, and thus, performs as a pixel define layer.

Similarly to the third insulating layer 17, the fourth insulating layer 19 may be formed to have a single-layered structure or a multi-layered structure including an inorganic insulating layer and/or an organic insulating layer.

In the previous embodiments, the display apparatus including the organic light emitting device is described as an example; however, one or more embodiments of the present invention are not limited thereto. That is, the embodiments of the present invention may be applied to various display apparatuses, for example, a display apparatus including a liquid crystal display device.

As described above, according to the one or more of the above embodiments of the present invention, the MIM capacitor having a large capacity may be formed while reducing the number of masks, and thus, manufacturing costs may be reduced and high resolution images may be displayed.

It should be understood that the exemplary embodiments described therein should be considered in a descriptive sense only and not for purposes of limitation. Descriptions of features or aspects within each embodiment should typically be considered as available for other similar features or aspects in other embodiments.

While one or more embodiments of the present invention have been described with reference to the figures, it will be understood by those of ordinary skill in the art that various changes in form and details may be made therein without departing from the spirit and scope of the present invention as defined by the following claims.

What is claimed is:
1. A display apparatus comprising:
a substrate comprising a major surface; and
a capacitor disposed over the substrate, the capacitor comprising:
a first electrode,
a second electrode disposed over the first electrode, the second electrode comprising a first region, a second region and an opening when viewed in a direction perpendicular to the major surface, the first region having a first thickness, a second region having a second thickness that is greater than the first thickness, and
a first insulating layer disposed between the first electrode and the second electrode.

2. The display apparatus of claim 1, wherein the first electrode comprises a semiconductor layer, and substantially the entire portion of the first electrode is doped with impurities.

3. The display apparatus of claim 1, wherein the first electrode comprises a concave portion recessed from a side when viewed in the direction.

4. The display apparatus of claim 3, wherein the opening of the second electrode overlaps at least partially with the concave portion when viewed in the direction.

5. The display apparatus of claim 1, wherein the first region of the second electrode overlaps with the first electrode, and the second region of the second electrode does not overlap with the first electrode when viewed in the direction.

6. The display apparatus of claim 1, wherein the first electrode is electrically connected to an external line through a contact hole exposing a portion of the first electrode overlapping with the opening when viewed in the direction.

7. The display apparatus of claim 1, further comprising:
a second insulating layer contacting an upper surface of the second region of the second electrode; and
a third insulating layer contacting an upper surface of the first region of the second electrode.

8. The display apparatus of claim 7, further comprising a thin film transistor comprising:
an active layer formed at a level substantially the same as that of the first electrode, and
a gate electrode formed at another level substantially the same as that of the second electrode,
wherein the first insulating layer is disposed between the active layer and the gate electrode.

9. The display apparatus of claim 8, wherein the gate electrode has the second thickness.

10. The display apparatus of claim 1, further comprising a thin film transistor comprising:
an active layer formed at a level substantially the same as that of the first electrode, and
a gate electrode formed at another level substantially the same as that of the second electrode.

11. The display apparatus of claim 10, wherein the gate electrode has the second thickness.

12. A method of manufacturing a display apparatus, the method comprising:
providing a substrate; and
forming a capacitor over the substrate,
wherein the capacitor comprises a first electrode of a capacitor, a second electrode and a first insulating layer disposed between the first electrode and the second electrode,
wherein the second electrode comprises a first region, a second region and an opening when viewed in a direction perpendicular to a major surface of the substrate, the first region having a first thickness, a second region having a second thickness that is greater than the first thickness.

13. The method of claim 12, wherein the first electrode of the capacitor comprises a concave portion recessed from a side of the first electrode when viewed in the direction, wherein the concave portion partially overlaps with the opening when viewed in the direction.

14. The method of claim 12, wherein the forming of the capacitor comprises forming the second electrode, which comprises:
forming a metallic layer portion having the second thickness and including the opening over the first insulating layer;
forming a second insulating layer on the metallic layer portion; and
etching the second insulating layer and the metallic layer portion such that a portion of the metallic layer portion has the first thickness, thereby forming the second electrode comprising the first region with the first thickness and the second region with the second thickness.

15. The method of claim 14, wherein the forming of the capacitor comprises forming the first electrode, which comprises:
forming a semiconductor layer portion over the substrate;
prior to the forming of the second insulating layer, primarily doping the semiconductor layer portion with impurities through the opening of the metallic layer portion; and
subsequently to the etching, secondarily doping the semiconductor layer portion with impurities through the first region of the second electrode.

16. The method of claim 14, further comprising forming a contact hole through the second insulating layer such that the contact hole exposes a portion of the first electrode which overlaps with the opening when viewed in the direction.

17. The method of claim 16, further comprising forming a conductive connector connecting the first electrode to an external line via the contact hole.

18. The method of claim 14, further comprising forming, on the second electrode, a third insulating layer covering and contacting the first region of the second electrode.

19. The method of claim 15, further comprising forming a thin film transistor, which comprises:
forming another semiconductor layer portion simultaneously with the forming of the semiconductor layer portion;
forming a gate electrode simultaneously with the forming of the metallic layer portion; and
doping the other semiconductor layer portion with impurities thereby forming an active layer comprising a source and a drain, wherein the doping of the other semiconductor layer portion is simultaneous with the doping of the semiconductor layer portion.

20. The method of claim 19, wherein the gate electrode has the second thickness.

* * * * *